US012628458B2

(12) United States Patent
Honishi et al.

(10) Patent No.: US 12,628,458 B2
(45) Date of Patent: May 12, 2026

(54) METHOD FOR MANUFACTURING STACKED THIN FILM, METHOD FOR MANUFACTURING SOLAR CELL, MULTI-JUNCTION SOLAR CELL, SOLAR CELL MODULE, AND PHOTOVOLTAIC POWER GENERATION SYSTEM

(71) Applicants:KABUSHIKI KAISHA TOSHIBA, Tokyo (JP); TOSHIBA ENERGY SYSTEMS & SOLUTIONS CORPORATION, Kawasaki-shi (JP)

(72) Inventors: Yuya Honishi, Saitama Saitama (JP); Soichiro Shibasaki, Nerima Toyko (JP); Naoyuki Nakagawa, Tokyo (JP); Yukitami Mizuno, Tokyo (JP); Mutsuki Yamazaki, Yokohama Kanagawa (JP); Yasutaka Nishida, Tokyo (JP); Kazushige Yamamoto, Yokohama Kanagawa (JP); Taro Asakura, Tokyo (JP)

(73) Assignees: KABUSHIKI KAISHA TOSHIBA, Tokyo (JP); TOSHIBA ENERGY SYSTEMS & SOLUTIONS CORPORATION, Kawasaki (JP)

( * ) Notice: Subject to any disclaimer, the term of this patent is extended or adjusted under 35 U.S.C. 154(b) by 878 days.

(21) Appl. No.: 17/894,306

(22) Filed: Aug. 24, 2022

(65) Prior Publication Data

US 2022/0406957 A1      Dec. 22, 2022

Related U.S. Application Data

(63) Continuation of application No. PCT/JP2021/033995, filed on Sep. 15, 2021.

(30) Foreign Application Priority Data

Mar. 24, 2021    (JP) ................................. 2021-049685

(51) Int. Cl.
 *H10F 10/161*        (2025.01)
 *H10F 10/16*         (2025.01)
      (Continued)

(52) U.S. Cl.
 CPC ............. *H10F 71/00* (2025.01); *H10F 10/16* (2025.01); *H10F 10/19* (2025.01); *H10F 10/167* (2025.01); *H10F 77/12* (2025.01)

(58) Field of Classification Search
 CPC .......... H10F 71/00; H10F 10/16; H10F 10/19; H10F 10/167; H10F 77/12; H10F 10/161; Y02E 10/50
 See application file for complete search history.

(56) References Cited

U.S. PATENT DOCUMENTS

2013/0298985 A1    11/2013    Darvish et al.
2020/0006583 A1    1/2020    Shibasaki et al.
      (Continued)

FOREIGN PATENT DOCUMENTS

CN        103189994        7/2013
CN        105161625        12/2015
      (Continued)

OTHER PUBLICATIONS

Taewoo et al, Single-crystalline Cu2O thin films of optical quality as obtained by the oxidation of single-crystal Cu thin films at low temperature, APL Mater. Mar. 1, 2019; 7 (3): 031115. (Year: 2019).*
      (Continued)

*Primary Examiner* — Dale E Page
*Assistant Examiner* — Daniel J Hibbert
(74) *Attorney, Agent, or Firm* — Amin, Turocy & Watson, LLP

(57) ABSTRACT
A method for manufacturing a stacked thin film of an embodiment includes forming a p-electrode on a substrate, forming a film that mainly contains a cuprous oxide and/or
      (Continued)

a complex oxide of cuprous oxides on the p-electrode, and performing an oxidation treatment on the film that mainly contains the cuprous oxide and/or the complex oxide of cuprous oxides. An ozone partial pressure in the oxidation treatment is 5 [Pa] or more and 200 [Pa] or less, a treatment temperature in the oxidation treatment is 273 [K] or more and 323 [K] or less, and a treatment time in the oxidation treatment is 1 second or more and 60 minutes or less.

18 Claims, 7 Drawing Sheets

(51) Int. Cl.
| | |
|---|---|
| *H10F 10/19* | (2025.01) |
| *H10F 71/00* | (2025.01) |
| *H10F 10/167* | (2025.01) |
| *H10F 77/12* | (2025.01) |

(56) References Cited

U.S. PATENT DOCUMENTS

| | | |
|---|---|---|
| 2020/0006589 A1* | 1/2020 | Yamamoto ............ H10F 77/311 |
| 2021/0013360 A1 | 1/2021 | Shibasaki et al. |
| 2021/0391491 A1 | 12/2021 | Honishi et al. |

FOREIGN PATENT DOCUMENTS

| | | |
|---|---|---|
| CN | 105762219 | 7/2016 |
| CN | 110112225 | 8/2019 |
| CN | 111868941 | 10/2020 |
| JP | 2014-170865 | 9/2014 |
| JP | 2017-054917 | 3/2017 |
| JP | 2018-024895 | 2/2018 |
| JP | 2018-046196 | 3/2018 |
| JP | 6790296 | 11/2020 |
| JP | 2021-150603 | 9/2021 |

OTHER PUBLICATIONS

B) Nishi et al., "High-efficiency Cu2O-based heterojunction solar cells fabricated on thermally oxidized copper sheets," 2011 37th IEEE Photovoltaic Specialists Conference, Seattle, WA, USA, 2011, pp. 000266-000270, doi: 10.1109/PVSC.2011.6185896 (Year: 2011).*
International Search Report for International Application No. PCT/JP2021/033995 mailed on Dec. 6, 2021, 6 pgs.
Wang, et al., "Redox Properties of Cu2O(100) and (111) Surfaces", J. Phys. Chem. C 2018, 122, 28684-28691.
J. Yamazaki, et al., "Fabrication of gas sensor using p-type polycrystalline Cu2O sheet" The 78th JSAP Autumn Meeting, Extended Abstracts, 2017.
Shibasaki, et al., "Transparent Cu2O solar cell for high-efficiency and low-cost tandem photovoltaics", 46th Photovoltaic Specialists Conference (PVSC) IEEE 2019 pp. 1061-1063.
Nishi Y, et al., "High-efficiency Cu2O-based heterojunction solar cells fabricated on thermally oxidized copper sheets". 37th Photovoltaic Specialists Conference (PVSC) IEEE 2011 pp. 000266-000270.

\* cited by examiner

| STEP OF FORMING p-ELECTRODE ON SUBSTRATE |
| :---: |

| STEP OF FORMING FILM THAT MAINLY CONTAINS CUPROUS OXIDE AND/OR COMPLEX OXIDE OF CUPROUS OXIDES ON p-ELECTRODE |
| :---: |

| STEP OF PERFORMING OXIDIZATION TREATMENT ON FILM THAT MAINLY CONTAINS CUPROUS OXIDE AND/OR COMPLEX OXIDE OF CUPROUS OXIDES |
| :---: |

| STEP OF FORMING n-TYPE LAYER ON FILM ON WHICH OXIDIZATION TREATMENT IS PERFORMED AND WHICH MAINLY CONTAINS CUPROUS OXIDE AND/OR COMPLEX OXIDE OF CUPROUS OXIDES |
| :---: |

| STEP OF FORMING n-ELECTRODE ON n-TYPE LAYER |
| :---: |

Fig. 3

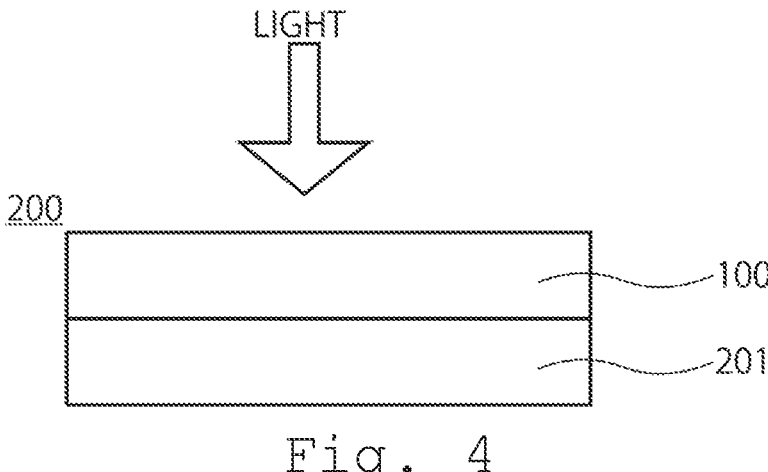

Fig. 4

| | Ozone partial pressure [Pa] | Treatment temperature [K] | Treatment time [min] | Total pressure [Pa] | UV (μW/cm²) | Evaluation formula |
|---|---|---|---|---|---|---|
| Example 1 | 7 | 298 | 5 | 280 | – | 3.0 |
| Example 2 | 10 | 298 | 5 | 400 | – | 4.2 |
| Example 3 | 20 | 298 | 5 | 800 | – | 8.1 |
| Example 4 | 20 | 298 | 5 | 800 | – | 8.3 |
| Example 5 | 30 | 298 | 5 | 1200 | – | 11.5 |
| Example 6 | 50 | 298 | 5 | 2000 | – | 17.5 |
| Example 7 | 80 | 298 | 5 | 3200 | – | 24.5 |
| Example 8 | 90 | 298 | 5 | 3600 | – | 26.4 |
| Example 9 | 200 | 298 | 5 | 8000 | – | 58.4 |
| Comparative Example 1 | 3 | 298 | 5 | 120 | – | 1.3 |
| Comparative Example 2 | – | – | – | – | – | – |
| Comparative Example 3 | 250 | 298 | 30 | 10000 | – | 40.8 |
| Example 10 | 20 | 273 | 20 | 800 | – | 6.9 |
| Example 11 | 20 | 283 | 20 | 800 | – | 7.4 |
| Example 12 | 20 | 293 | 20 | 800 | – | 7.8 |
| Example 13 | 20 | 303 | 20 | 800 | – | 8.3 |
| Example 14 | 20 | 313 | 20 | 800 | – | 8.7 |
| Example 15 | 20 | 323 | 20 | 800 | – | 9.2 |
| Comparative Example 4 | 30 | 253 | 20 | 800 | – | 6.0 |
| Comparative Example 5 | 20 | 353 | 20 | 800 | – | 10.5 |
| Example 16 | 20 | 273 | 0.01(1sec) | 800 | – | 0.1 |
| Example 17 | 20 | 273 | 1 | 800 | – | 6.0 |
| Example 18 | 20 | 273 | 10 | 800 | – | 6.9 |
| Example 19 | 20 | 273 | 20 | 800 | – | 6.9 |
| Example 20 | 20 | 273 | 30 | 800 | – | 6.9 |
| Example 21 | 20 | 273 | 45 | 800 | – | 6.9 |
| Example 22 | 20 | 273 | 60 | 800 | – | 6.9 |
| Example 23 | 100 | 323 | 60 | 4000 | – | 32.0 |
| Example 24 | 200 | 323 | 60 | 8000 | – | 43.8 |
| Comparative Example 7 | 20 | 273 | 100 | 800 | – | 6.9 |
| Example 25 | 200 | 323 | 0.01(1sec) | 8000 | – | 0.3 |
| Example 26 | 20 | 298 | 30 | 800 | 100 | 8.1 |
| Example 27 | 20 | 298 | 30 | 800 | 200 | 8.1 |
| Example 28 | 50 | 298 | 5 | 2000 | – | 17.5 |
| Example 29 | 50 | 298 | 5 | 5000 | – | 17.5 |
| Example 30 | 50 | 298 | 5 | 100000 | – | 17.5 |
| Example 31 | 20 | 298 | 30 | 800 | – | 8.1 |

Fig. 10

| | Jsc | Voc | Conversion efficiency | Transmittance |
|---|---|---|---|---|
| Example 1 | B | B | B | A |
| Example 2 | B | B | B | A |
| Example 3 | A | A | A | A |
| Example 4 | A | A | A | A |
| Example 5 | A | A | A | A |
| Example 6 | A | A | A | A |
| Example 7 | B | B | B | B |
| Example 8 | B | B | B | B |
| Example 9 | B | C | C | C |
| Comparative Example 1 | C | C | C | A |
| Comparative Example 2 | 1 | 1 | 1 | 1 |
| Comparative Example 3 | C | C | C | C |
| Example 10 | A | A | A | A |
| Example 11 | A | A | A | A |
| Example 12 | A | A | A | A |
| Example 13 | A | A | A | A |
| Example 14 | A | A | A | A |
| Example 15 | A | A | A | A |
| Comparative Example 4 | C | C | C | A |
| Comparative Example 5 | C | C | C | C |
| Example 16 | B | C | C | A |
| Example 17 | A | A | A | A |
| Example 18 | A | A | A | A |
| Example 19 | A | A | A | A |
| Example 20 | A | A | A | A |
| Example 21 | A | A | A | A |
| Example 22 | A | A | A | A |
| Example 23 | B | C | C | C |
| Example 24 | B | C | C | C |
| Comparative Example 7 | C | C | C | C |
| Example 25 | B | C | C | A |
| Example 26 | A | A | A | A |
| Example 27 | A | A | A | A |
| Example 28 | A | A | A | A |
| Example 29 | A | A | A | A |
| Example 30 | A | A | A | A |
| Example 31 | A | A | A | A |

Fig. 11

METHOD FOR MANUFACTURING STACKED THIN FILM, METHOD FOR MANUFACTURING SOLAR CELL, MULTI-JUNCTION SOLAR CELL, SOLAR CELL MODULE, AND PHOTOVOLTAIC POWER GENERATION SYSTEM

CROSS-REFERENCE TO RELATED APPLICATION

This application is a Continuation application of PCT International Patent Application No. PCT/JP2021/33995, the International Filing Date of which is Sep. 15, 2021, which is based upon and claims the benefit of priority from Japanese Application 2021-049685, the filling Date of which is Mar. 24, 2021, the entire contents of both of which are incorporated herein by reference.

FIELD

Embodiments described herein relate generally to a method for manufacturing a stacked thin film, a method for manufacturing a solar cell, a multi-junction solar cell, a solar cell module, and a photovoltaic power generation system.

BACKGROUND

One of new solar cells is a solar cell using a cuprous oxide ($Cu_2O$) for a light-absorbing layer. $Cu_2O$ is a wide-gap semiconductor. Since $Cu_2O$ is a safe and inexpensive material including copper and oxygen abundantly present on the earth, it is expected that a high-efficiency and low-cost solar cell can be realized.

BRIEF DESCRIPTION OF THE DRAWINGS

FIG. 3 is a flowchart of a method for manufacturing a stacked thin film and a solar cell according to an embodiment;

FIG. 4 is a cross-sectional view of a multi-junction solar cell according to an embodiment;

FIG. 10 is a table related to Examples; and

FIG. 11 is a table related to Examples.

DETAILED DESCRIPTION

A method for manufacturing a stacked thin film of an embodiment includes forming a p-electrode on a substrate, forming a film that mainly contains a cuprous oxide and/or a complex oxide of cuprous oxides on the p-electrode, and performing an oxidation treatment on the film that mainly contains the cuprous oxide and/or the complex oxide of cuprous oxides. An ozone partial pressure in the oxidation treatment is 5 [Pa] or more and 200 [Pa] or less, a treatment time in the oxidation temperature in the oxidation treatment is 273 [K] or more and 323 [K] or less, and a treatment time in the oxidation treatment is 1 second or more and 60 minutes or less.

Hereinafter, an embodiment will be described in detail with reference to the drawings. Unless otherwise specified, values at 25° C. and 1 atm (atmosphere) are illustrated. An average represents an arithmetic mean value.

First Embodiment

Figure 1:
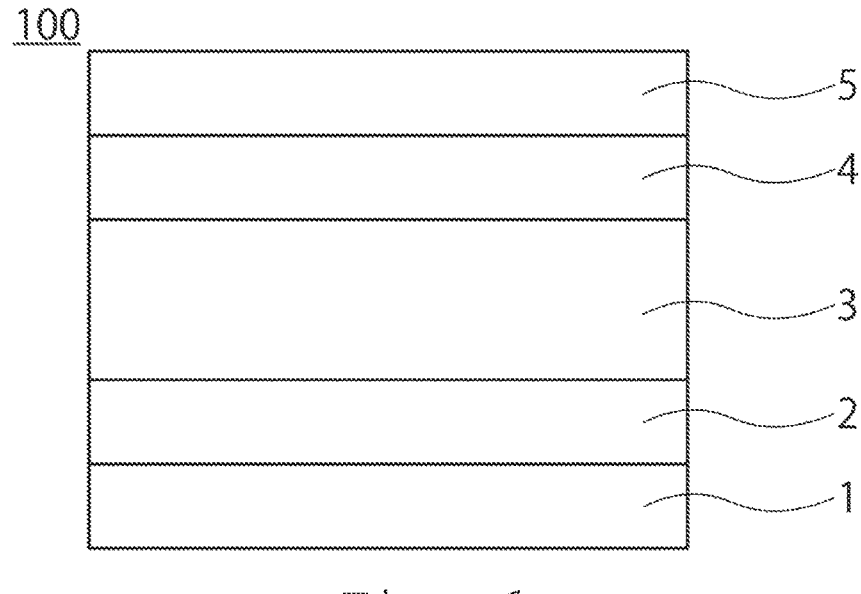
FIG. 1 is a cross-sectional view of a solar cell according to an embodiment.

A first embodiment relates to a method for manufacturing a stacked thin film, a solar cell, and a method for manufacturing a solar cell. The stacked thin film is a member in a procedure of manufacturing the solar cell, has a substrate, a p-electrode on the substrate, and a film that mainly contains a cuprous oxide and/or a complex oxide of cuprous oxides on the p-electrode. A surface of the film that mainly contains the cuprous oxide and/or the complex oxide of cuprous oxides is oxidized. FIG. 1 illustrates a cross-sectional view of a solar cell 100 of the first embodiment. As illustrated in FIG. 1, the solar cell 100 according to the present embodiment includes a substrate 1, a p-electrode 2 as a first electrode, a p-type light-absorbing layer 3, an n-type layer 4, and an n-electrode 5 as a second electrode. An intermediate layer (not illustrated) may be included between the n-type layer 4 and the n-electrode 5. Sunlight may be incident from either the n-electrode 5 side or the p-electrode 2 side, but is more preferably incident from the n-electrode 5 side. Since the solar cell 100 of the embodiment is a transmissive solar cell, it is preferable that the solar cell is used as a top cell (light incident side) of a multi-junction solar cell. In FIG. 1, the substrate 1 is provided on a side of the p-electrode 2 opposite to the p-type light-absorbing layer 3 side, but the substrate 1 may be provided on a side of the n-electrode 5 opposite to the n-type layer 4 side. Hereinafter, although a mode illustrated in FIG. 1 will be described, a mode in which the substrate 1 is provided on the n-electrode 5 side except that a position of the substrate 1 is different is also used. In the solar cell 100 of the embodiment, light is incident from the n-electrode 5 side toward the p-electrode 2 side.

The substrate 1 is a transparent substrate. A transparent organic substrates such as acrylic, polyimide, polycarbonate, polyethylene terephthalate (PET), polypropylene (PP), fluorine-based resins (polytetrafluoroethylene (PTFE), perfluoroethylene propene copolymer (FEP), ethylene tetrafluoroethylene copolymer (ETFE), polychlorotrifluoroethylene (PCTFE), perfluoroalkoxy alkane (PFA), and the like), polyarylate, polysulfone, polyethersulfone, and polyetherimide and inorganic substrates such as soda lime glass, white glass, chemically strengthened glass, and quartz can be used as the substrate 1. As the substrate 1, the substrates listed above can be laminated.

The p-electrode 2 is provided on the substrate 1 and is disposed between the substrate 1 and the p-type light-absorbing layer 3. The p-electrode 2 is a conductive layer having transparency provided on the p-type light-absorbing layer 3 side. A thickness of the p-electrode 2 is typically 100 nm or more and 2,000 nm or less. In FIG. 1, the p-electrode 2 is in direct contact with the p-type light-absorbing layer 3. It is preferable that the p-electrode 2 includes one or more layers of transparent conductive oxide films (semiconductor conductive films). The transparent conductive oxide film is not particularly limited, and is an indium tin oxide (ITO), an Al-doped zinc oxide (AZO), a boron-doped zinc oxide (BZO), a gallium-doped zinc Oxide (GZO), a doped tin oxide, a titanium-doped indium oxide (ITiO), an indium zinc oxide (IZO), an indium gallium zinc oxide (IGZO), a hydrogen-doped indium oxide (IOH), or the like. The transparent conductive oxide film may be a stacked film having a plurality of films. A dopant for a film of tin oxide or the like is not particularly limited as long as the dopant is one or more selected from the group consisting of In, Si, Ge, Ti, Cu, Sb, Nb, Ta, W, Mo, F, Cl, and the like. It is preferable that the p-electrode 2 preferably includes a tin oxide film doped with one or more elements selected from the group consisting of In, Si, Ge, Ti, Cu, Sb, Nb, Ta, W, Mo, F, Cl, and the like. In the doped tin oxide film, one or more elements selected from the group consisting of In, Si, Ge, Ti, Cu, Sb, Nb, Ta, W, Mo, F, Cl, and the like are preferably contained at 10 atom % or less with respect to tin contained in the tin oxide film. As the p-electrode 2, a stacked film in which a transparent conductive oxide film and a metal film are stacked can be used. The metal film preferably has a thickness of 10 nm or less. Metal (including alloy) contained in the metal film is not particularly limited, and is Mo, Au, Cu, Ag, Al, Ta, W, or the like. It is preferable that the p-electrode 2 includes a dot-shaped, line-shaped, or mesh-shaped electrode (one or more selected from the group consisting of metal, an alloy, graphene, a conductive nitride, and a conductive oxide) between the transparent conductive oxide film and the substrate 1 or between the transparent conductive oxide film and the p-type light-absorbing layer 3. It is preferable that the dot-shaped, line-shaped, or mesh-shaped metal has an aperture ratio of 50% or more with respect to the transparent conductive film. The dot-like, line-like, or mesh-like metal is not particularly limited, and is Mo, Au, Cu, Ag, Al, Ta, W, or the like. When the metal film is used for the p-electrode 2, it is preferable that a film thickness is about 5 nm or less from the viewpoint of transparency. When the line-shaped or mesh-shaped metal film is used, since the transparency is secured at an opening, the film thickness of the metal film is not limited thereto.

It is preferable that the p-electrode 2 have a stacked structure in which an indium tin oxide film and a doped tin oxide film are stacked on each other. Specifically, it is preferable that the p-electrode have one or more stacked structures selected from the group including a stacked film of an indium tin oxide film and an antimony-doped tin oxide film, a stacked film of an indium tin oxide film and a fluorine-doped tin oxide film, a stacked film of an indium tin oxide film and a Ta-doped tin oxide film, and a stacked film of an indium tin oxide film and a Nb-doped tin oxide film. When the first transparent electrode 1 includes a doped tin oxide film, it is preferable that the doped tin oxide film be in direct contact with the p-type light-absorbing layer 3.

The p-type light-absorbing layer 3 is a p-type semiconductor layer. The p-type light-absorbing layer 3 may be in direct contact with the p-electrode 2, or other layers may be present as long as the contact with the p-electrode 2 can be secured. The p-type light-absorbing layer 3 is disposed between the p-electrode 2 and the n-type layer 4. The p-type light-absorbing layer 3 is in direct contact with the n-type layer 4. The p-type light-absorbing layer 3 is a semiconductor layer of a metal oxide containing Cu as a main component. The metal oxide containing Cu as the main component is a cuprous oxide or/and a complex oxide of cuprous oxides. That is, the p-type light-absorbing layer 3 is a film that mainly contains a cuprous oxide and/or a complex oxide of cuprous oxides. The p-type light-absorbing layer 3 is preferably a polycrystal of the cuprous oxide or/and the complex oxide of cuprous oxides. The cuprous oxide or/and the complex oxide of cuprous oxides is an oxide represented by $Cu_aM1_bO_c$. M1 is preferably one or more elements selected from the group consisting of Sn, Sb, Ag, Li, Na, K, Cs, Rb, Al, In, Zn, Mg, and Ca. a, b, and c preferably satisfy $1.80 \leq a \leq 2.01$ (a is 1.80 or more and 2.01 or less), $0.00 \leq b \leq 0.20$ (b is 0.00 or more and 0.20 or less), and $0.98 \leq c \leq 1.02$ (c is 0.98 or more and 1.02 or less). 90 wt % or more of the p-type light-absorbing layer 3 is preferably a cuprous oxide or/and the complex oxide of cuprous oxides. 95 wt % or more of the p-type light-absorbing layer 3 is more preferably a cuprous oxide or/and a complex oxide of cuprous oxides. 98 wt % or more of the p-type light-absorbing layer 3 is still more preferably a cuprous oxide or/and a complex oxide of cuprous oxides. It is preferable that the p-type light-absorbing layer 3 hardly contains Cu or/and CuO which is a heterogeneous phase. Since the transmittance of the p-type light-absorbing layer 3 is increased, it is preferable that the p-type light-absorbing layer 3 contains less heterogeneous phases and has good crystallinity. When the p-type light-absorbing layer 3 contains an element of M2, a band gap of the p-type light-absorbing layer 3 can be adjusted. The band gap of the p-type light-absorbing layer 3 is preferably 2.0 eV or more and 2.2 eV or less. When the band gap is in such a range, sunlight can be efficiently used in both a top cell and a bottom cell in the multi-junction solar cell in which the solar cell using Si for the light-absorbing layer is used as the bottom cell and the solar cell of the embodiment is used as the top cell. It is preferable that the p-type light-absorbing layer 3 contains Sn or/and Sb. Sn or Sb in the p-type light-absorbing layer 3 may be added to the light-absorbing layer 3 or may be derived from the p-electrode 2.

A composition ratio of the p-type light-absorbing layer 3 is a composition ratio of the entire p-type light-absorbing layer 3. It is preferable that a compound composition ratio of the p-type light-absorbing layer 3 is entirely satisfied in the p-type light-absorbing layer 3. When concentrations of Sn and Sb in the p-type light-absorbing layer 3 are high, defects increase, and carrier recombination increases. Thus, a total volume concentration of Sb and Sn in the p-type light-absorbing layer 3 is preferably $1.5*10^{19}$ atoms/cm$^3$ or less.

Figure 2:
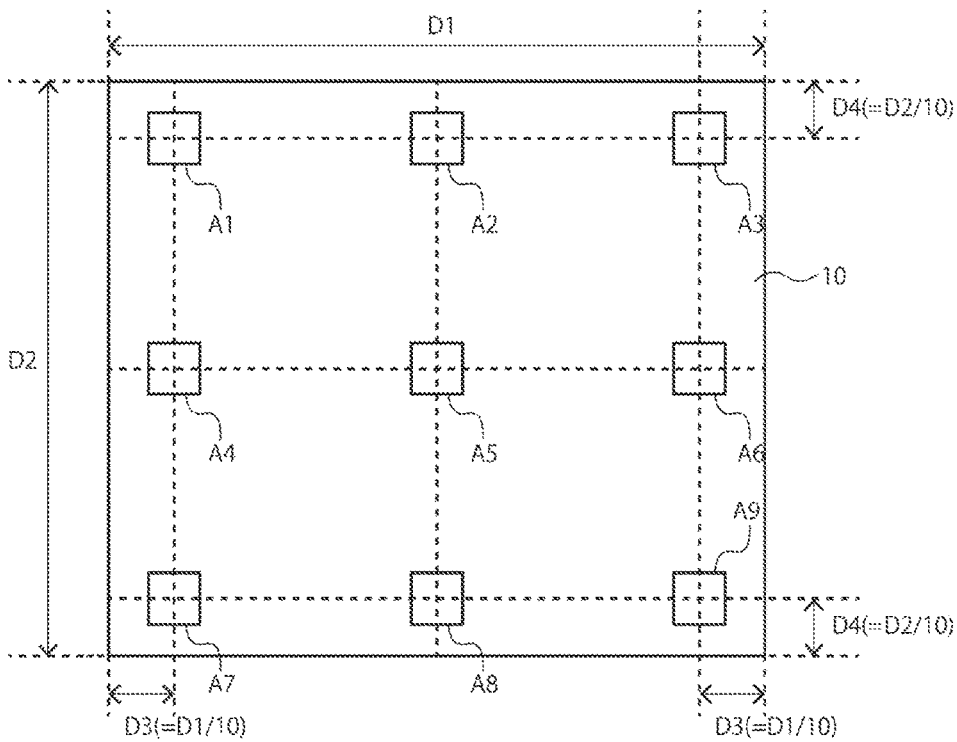
FIG. 2 is a diagram illustrating analysis spots of a solar cell according to an embodiment.

When a thickness of the p-type light-absorbing layer 3 is $d_3$, a composition of the p-type light-absorbing layer 3 is an average value of compositions at depths of $0.2d_3$, $0.5d_3$, and $0.8d_3$ from a surface of the p-type light-absorbing layer 3 on the p-electrode 2 side. Unless there is a condition that an elemental composition ratio of the compound of the p-type light-absorbing layer 3 is inclined, the p-type light-absorbing layer 3 preferably satisfies the above compositions and the following suitable compositions at the depths. In the analysis, analysis spots (A1 to A9) distributed as evenly as possible at equal intervals as represented in the diagram for describing analysis spots of FIG. 2 at each distance from the surface of the n-type layer are analyzed by, for example, secondary ion mass spectrometry (SIMS). FIG. 2 is a schematic diagram of the solar cell 100 as viewed from the light incident side. When the composition of the p-type light-absorbing layer 3 is analyzed, D1 is a length of the p-type light-absorbing layer 3 in a width direction, and D2 is a length of the p-type light-absorbing layer 3 in a depth direction.

A thickness of the p-type light-absorbing layer 3 is obtained by cross-sectional observation with an electron microscope or a step profiler, and is preferably 1,000 nm or more and 10,000 nm or less.

The p-type light-absorbing layer 3 may contain an element such as Ga diffused from the n-type layer 4. Ga is not contained in a raw material for forming the p-type light-absorbing layer 3, and Ga contained in the n-type layer 4 is diffused into the p-type light-absorbing layer 3. When other elements are also used at the time of forming the n-type layer 4, these elements may also be diffused into the p-type light-absorbing layer 3.

The n-type layer 4 is an n-type semiconductor layer. The n-type layer 4 is disposed between the p-type light-absorbing layer 3 and the n-electrode 5. The n-type layer 4 is in direct contact with a surface of the p-type light-absorbing layer 3 opposite to a surface in contact with the p-electrode 2. It is preferable that the n-type layer 4 is an oxide semiconductor layer containing Ga and contains an oxide having Ga as a main component. In the n-type layer 4, an oxide having Ga as a main component may be mixed with another oxide, an oxide having Ga as a main component may be doped with another element, or an oxide having Ga as a main component and doped with another element may be mixed with another oxide. The n-type layer 4 is a single layer or a multilayer. In the metal elements contained in the n-type layer 4, Ga is preferably 50 atom % or more. The metal elements contained in the n-type layer 4 may be inclined from the p-type light-absorbing layer 3 side to the n-electrode 5 side.

The n-type layer 4 preferably contains 90 wt % or more of an oxide containing M2 and Ga which are one or more elements selected from the group consisting of Al, B, In, Ti, Zn, Hf, Zr, Sn, Si, and Ge.

90 wt % or more of the n-type layer 4 is preferably an oxide containing M2 and Ga. 95 wt % or more of the n-type layer 4 is more preferably an oxide containing M2 and Ga. 98 wt % or more of the n-type layer 4 is still more preferably a compound represented by an oxide containing M2 and Ga. The n-type layer 4 more preferably contains a compound represented by an oxide containing M2 and Ga except for an intermediate region to be described below.

A composition of the compound of the n-type layer 4 is an average composition of the entire n-type layer 4 unless otherwise specified. When a thickness of the n-type layer 4 is $d_4$, a composition of the n-type layer 4 is an average value of compositions at depths of $0.2d_4$, $0.5d_4$, and $0.8d_4$ from a surface of the n-type layer 4 on the p-type light-absorbing layer 3 side. Unless there is a condition that an elemental composition ratio of the compound of the n-type layer 4 is inclined, the n-type layer 4 preferably satisfies the above compositions and the following suitable compositions at the depths. When the n-type layer 4 is very thin (for example, 5 nm or less), the composition at a depth of 0.5d from the surface of the n-type layer 4 on the p-type light-absorbing layer 3 side can be regarded as the composition of the entire n-type layer 4. In the analysis, analysis spots (A1 to A9) distributed as evenly as possible at equal intervals as represented in the diagram for describing analysis spots of FIG. 2 at each distance from the surface of the n-type layer 4 are analyzed by, for example, secondary ion mass spectrometry (SIMS). FIG. 2 is a schematic diagram of the solar cell 100 as viewed from the light incident side. When the composition of the n-type layer 4 is analyzed, D1 is a length of the n-type layer 4 in the width direction, and D2 is a length of the n-type layer 4 in the depth direction.

It is preferable that an intermediate region is included between the p-type light-absorbing layer 3 and the n-type layer 4. The intermediate region is a transition region of the p-type light-absorbing layer 3 and the n-type layer 4. The intermediate region includes heterogeneous phases of a cuprous oxide and a complex oxide of cuprous oxides of the p-type light-absorbing layer 3 that becomes an interface defect. Examples of the heterogeneous phase included in the intermediate region include one or more selected from the group consisting of a CuO phase, a Cu phase, and a $Cu(OH)_2$ phase. It is preferable that the intermediate region includes the CuO phase.

An interface between the p-type light-absorbing layer 3 and the n-type layer 4 may not be clear. When the interface between the p-type light-absorbing layer 3 and the n-type layer 4 is not clear, a central portion of the unclear portion between the p-type light-absorbing layer 3 and the n-type layer 4 is defined as the interface between the p-type light-absorbing layer 3 and the n-type layer 4. The interface between the p-type light-absorbing layer 3 and the n-type layer 4 may be not a flat but uneven. The interface between the p-type light-absorbing layer 3 and the n-type layer 4 can be specified by observing cross sections of the p-type light-absorbing layer 3 and the n-type layer 4. Since the unclear portion between the p-type light-absorbing layer 3 and the n-type layer 4 contains the heterogeneous phase, a width of the unclear portion between the p-type light-absorbing layer 3 and the n-type layer 4 is 0 nm or more and 10 nm or less, preferably 1 nm or more and 5 nm or less, and more preferably 2 nm or more and 4 nm or less in a stacking direction of the p-type light-absorbing layer 3 and the n-type layer 4.

The n-type layer 4 may contain an element such as Cu diffused from the p-type light-absorbing layer 3. Cu is not contained in a raw material for forming the n-type layer 4, and Cu contained in the p-type light-absorbing layer 3 is diffused into the n-type layer 4. When other elements are also used at the time of forming the p-type light-absorbing layer 3, these elements may also be diffused into the n-type layer 4.

The n-electrode 5 is an electrode on the n-type layer 4 side having optical transparency to visible light. The n-type layer 4 is sandwiched between the n-electrode 5 and the p-type light-absorbing layer 3. An intermediate layer (not illustrated) can be provided between the n-type layer 4 and the n-electrode 5. The intermediate layer can include a mesh-shaped or line-shaped electrode. It is preferable that an transparent conductive oxide film (semiconductor conductive film) is used for the n-electrode 5. It is preferable that the transparent conductive oxide film used for the n-electrode 5 is one or more kinds of transparent conductive films selected from the group consisting of an indium tin oxide, an aluminum-doped zinc oxide, a boron-doped zinc oxide, a gallium-doped zinc oxide, an indium-doped zinc oxide, a titanium-doped indium oxide, an indium gallium zinc oxide, and a hydrogen-doped indium oxide. Graphene can also be used for the n-electrode 5. It is preferable that the graphene is stacked with a silver nanowire.

A thickness of the n-electrode 5 is obtained by cross-sectional observation with an electron microscope or a step gauge, and is not particularly limited, but is typically 1 nm or more and 2 μm or less.

The p-type light-absorbing layer 3 is preferably formed by, for example, sputtering. After the p-type light-absorbing layer 3 is formed, an oxidation treatment is performed on the surface of the p-type light-absorbing layer 3.

Next, a method for manufacturing the stacked thin film and the solar cell 100 will be described. FIG. 3 illustrates a flowchart of a method for manufacturing the solar cell 100 of the embodiment. A method for manufacturing the solar cell 100 of the embodiment includes a step of forming the p-electrode 2 on the substrate 1, a step of forming the film that mainly contains the cuprous oxide and/or the complex oxide of cuprous oxides on the p-electrode 2, a step of performing the oxidation treatment on the film that mainly contains the cuprous oxide and/or the complex oxide of cuprous oxides, a step of forming the n-type layer 4 on the film on which the oxidation treatment is performed and which mainly contains the cuprous oxide and/or the complex oxide of cuprous oxides, and a step of forming the n-electrode 5 on the n-type layer 4. The method for manufacturing the stacked thin film includes the step of forming the p-electrode 2 on the substrate 1, the step of forming the film that mainly contains the cuprous oxide and/or the complex oxide of cuprous oxides on the p-electrode 2, and the step of performing the oxidation treatment on the film that mainly contains the cuprous oxide and/or the complex oxide of cuprous oxides.

First, as the step of forming the p-electrode 2 on the substrate 1, the p-electrode 2 is formed on the substrate 1. The transparent conductive oxide film is formed by, for example, sputtering. When the p-electrode 2 includes a metal film, a mesh-shaped metal, or a line-shaped metal, these metals are formed and are patterned as necessary.

Subsequently, as the step of forming the film that mainly contains the cuprous oxide and/or the complex oxide of cuprous oxides on the p-electrode 2, the film that mainly contains the cuprous oxide and/or the complex oxide of cuprous oxides is formed on the p-electrode 2 of the member in which the p-electrode 2 is formed on the substrate 1. It is preferable that the film that mainly contains the cuprous oxide and/or the complex oxide of cuprous oxides is formed by sputtering. It is preferable that the film that mainly containing the cuprous oxide and/or the complex oxide of cuprous oxides having few heterogeneous phases is formed. It is preferable that sputtering is performed by heating the member in which the p-electrode 2 is formed on the substrate 1 to a temperature of 300° C. or more and 600° C. or less in a range of an oxygen partial pressure of 0.01 [Pa] or more and 4.8 [Pa] or less in a range of 0.02 μm/min or more and 20 μm/min or less. From the viewpoint of forming a polycrystalline film having high permeability and a large particle diameter, when a deposition rate is d, the oxygen partial pressure more preferably satisfies 0.55 xd [Pa] or more and 1.00 xd [Pa] or less. The heating temperature is more preferably 350° C. or more and 500° C. or less. The element of M1 can be added during the formation of the film that mainly contains the cuprous oxide and/or the complex oxide of cuprous oxides.

As the step of performing the oxidation treatment on the film that mainly contains the cuprous oxide and/or the complex oxide of cuprous oxides, the oxidation treatment is performed on the member in which the p-electrode 2 is formed on the substrate 1 and the film that mainly contains the cuprous oxide and/or the complex oxide of cuprous oxides is formed on the p-electrode 2. The oxidation treatment is performed in an atmosphere containing ozone at a predetermined temperature. The oxidation treatment is performed, and an extremely thin region on the surface of the film that mainly contains the cuprous oxide and/or the complex oxide of cuprous oxides, for example, 5 nm or less from the surface of the film is oxidized. When the oxidation treatment is performed at a high temperature condition, the oxidation proceeds to a deep portion of the film that mainly contains the cuprous oxide and/or the complex oxide of cuprous oxides, and a copper oxide or the like is excessively generated inside the film. Thus, the transparency of the film and the conversion efficiency of the solar cell are deteriorated. The oxidation treatment includes treating a member in which the p-electrode 2 is formed on the substrate 1 and the film that mainly contains the cuprous oxide and/or the complex oxide of cuprous oxides is formed on the p-electrode 2 in a vacuum chamber in an atmosphere containing ozone. From the above viewpoint, a region to be oxidized is preferably 5 nm or less, and preferably 3 nm or less from the exposed surface of the film that mainly contains the cuprous oxide and/or the complex oxide of cuprous oxides toward the deep portion of the film.

When the oxidation treatment is performed on the member in which the film that mainly contains the cuprous oxide and/or the complex oxide of cuprous oxides is formed, the cuprous oxide and/or the complex oxide of cuprous oxides on the surface of the film is partially oxidized, and is changed to the CuO phase, the $Cu(OH)_2$ phase, or the like. The presence of these heterogeneous phases can be confirmed by X-ray diffraction (XRD) or X-ray photoelectron spectroscopy (XPS).

It is preferable that the member in which the film that mainly contains the cuprous oxide and/or the complex oxide of cuprous oxides is formed on the p-electrode 2 is stored so as not to cause an unintended oxidation reaction before and after the oxidation treatment. It is preferable that the member after the oxidation treatment is stored in an atmosphere having an oxygen partial pressure of 50 [Pa] or less and 100° C. or less, more preferably 50° C. or less or the formation of the n-type layer 4 is continuously performed after the step of performing the oxidation treatment on the film that mainly contains the cuprous oxide and/or the complex oxide of cuprous oxides is performed. For example, the member on which the oxidation treatment is performed for 1 hour or less, preferably 30 minutes or less in an air atmosphere of 30° C. or less can be stored until the formation of the n-type layer 4. Before the oxidation treatment, the member can be stored in an atmosphere having an oxygen partial pressure of 50 [Pa] or less and 100° C. or less, more preferably 50° C. or less, or can be stored in an air atmosphere of 30° C. or less for 1 hour or less, preferably 30 minutes or less. In these storage atmospheres, ozone may be contained at 0.1% or less of the oxygen partial pressure.

In the oxidation treatment, the member in which the film that mainly contains the cuprous oxide and/or the complex oxide of cuprous oxides is formed on the p-electrode 2 is placed on a stage in a vacuum chamber, and a pressure is reduced such that a total pressure becomes $2*10^{-4}$ [Pa] or more and $1*10^{-1}$ [Pa] or less before a gas containing oxygen is introduced. An ozone ($O_3$) gas is introduced after the total pressure in the vacuum chamber is stabilized. Before the ozone gas is introduced, a temperature of the member in which the film that mainly contains the cuprous oxide and/or the complex oxide of cuprous oxides is formed on the p-electrode 2 is adjusted to the following temperature.

The atmosphere of the oxidation treatment contains ozone. The atmosphere of the oxidation treatment may contain oxygen, carbon dioxide, argon, He, or nitrogen in addition to the ozone. Since the atmosphere of the oxidation treatment does not contain a reactive gas other than the ozone, the oxygen, and the carbon dioxide, a reactive gas other than the ozone, the oxygen, and the carbon dioxide is not introduced into the chamber in which the oxidation treatment is performed. The term "not contain" means zero or substantially zero. The total pressure in the vacuum chamber in the oxidation treatment is preferably 10000 [Pa] or less, more preferably 5000 [Pa] or less, still more preferably 1000 [Pa] or less. A lower limit of the total pressure in the vacuum chamber in the oxidation treatment is higher than an ozone partial pressure, and is, for example, 5 [Pa] or more.

In the oxidation treatment, the ozone partial pressure is preferably 5 [Pa] or more and 200 [Pa] or less. When the ozone partial pressure is too low, a treatment time becomes long and productivity is deteriorated, or an oxidation reaction does not proceed. When the ozone partial pressure is too high, the oxidation reaction proceeds from the surface of the cuprous oxide and/or the complex oxide of cuprous oxides to the deep portion. Thus, the ozone partial pressure in the oxidation treatment is more preferably 5 [Pa] or more and 100 [Pa] or less, more preferably 7 [Pa] or more and 100 [Pa] or less, and still more preferably 10 [Pa] or more and 50 [Pa] or less. The oxygen partial pressure and the ozone partial pressure are values in the chamber.

In the oxidation treatment, the treatment temperature is preferably 273 [K] or more and 323 [K] or less (0 [degree Celsius] or more and 50 [degrees Celsius] or less). When the treatment temperature is too low, the treatment time becomes long, the productivity is deteriorated, or the oxidation reaction does not proceed. When the treatment temperature is too high, the oxidation reaction proceeds from the surface of the cuprous oxide and/or the complex oxide of cuprous oxides to the deep portion. Thus, the treatment temperature in the oxidation treatment is still more preferably 283 [K] or more and 308 [K] or less (10 [degrees Celsius] or more and 35 [degrees Celsius] or less). The treatment temperature is a temperature of the surface of the cuprous oxide and/or the complex oxide of cuprous oxides. Since the oxidation reaction proceeds gently, the heat generated by the oxidation reaction is slight. Thus, the temperature of the surface of the cuprous oxide and/or the complex oxide of cuprous oxides of the member in which the film that mainly contains the cuprous oxide and/or the complex oxide of cuprous oxides is formed on the p-electrode 2 is substantially the same as the temperature of the member in which the film that mainly contains the cuprous oxide and/or the complex oxide of cuprous oxides is formed on the p-electrode 2. The temperature of the member in which the film that mainly contains the cuprous oxide and/or the complex oxide of cuprous oxides is formed on the p-electrode 2 is a set temperature of a stage of the chamber used for the oxidation treatment.

In the oxidation treatment, the treatment time is preferably 1 second (about 0.017 minutes) or more and 60 minutes or less. When the treatment time is too short, the oxidation reaction does not proceed. When the treatment time is too long, the oxidation reaction proceeds from the surface of the cuprous oxide and/or the complex oxide of cuprous oxides to the deep portion. Thus, the treatment time in the oxidation treatment is more preferably 1 minute or more and 30 minutes or less, still more preferably 1 minute or more and 10 minutes or less.

When the ozone partial pressure in the oxidation treatment is high, the progress of the oxidation can be easily controlled by lowering the treatment temperature or shortening the treatment time. When the treatment temperature of the oxidation treatment is high, the progress of the oxidation can be easily controlled by lowering the ozone partial pressure or shortening the treatment time.

When the ozone partial pressure in the oxidation treatment is low, the progress of the oxidation can be easily controlled by increasing the treatment temperature or increasing the treatment time. When the treatment temperature of the oxidation treatment is low, the progress of the oxidation can be easily controlled by increasing the ozone partial pressure or increasing the treatment time.

The oxidation treatment of the embodiment is easily affected by the ozone partial pressure, the treatment temperature, and the treatment time. When the ozone partial pressure is high, the temperature is high, or the treatment time is long, the oxidation reaction is promoted. The oxidation treatment is performed such that these three conditions satisfy the above range, and thus, it is possible to oxidize the extremely thin region on the surface of the film that mainly contains the cuprous oxide and/or the complex oxide of cuprous oxides. In particular, the ozone partial pressure (P [Pa]), the treatment temperature (Temp [K]), and the treatment time (Time [min]) in the oxidation treatment preferably satisfy the following relationship. In the following relational expression, multiplication is represented by * (asterisk). It is preferable that a relationship of $1.0 \leq 240*(1-\exp(-0.01*P))*\exp(-4175/8.31/\text{Temp})*(1-\exp(-2*\text{Time})) \leq 50.0$ is satisfied ("$240*(1-\exp(-0.01*P))*\exp(-4175/8.31/\text{Temp})*(1-\exp(-2*\text{Time}))$" is 1.0 or more and 50.0 or less)), it is preferable that a relationship of $3.0 \leq 240*(1-\exp(-0.01*P))*\exp(-4175/8.31/\text{Temp})*(1-\exp(-2*\text{Time})) \leq 35.0$ is satisfied ("$240*(1-\exp(-0.01*P))*\exp(-4175/8.31/\text{Temp})*(1-\exp(-2*\text{Time}))$" is 3.0 or more and 35.0 or less)), and it is more preferable that a relationship of $5.0 \leq 240*(1-\exp(-0.01*P))*\exp(-4175/8.31/\text{Temp})*(1-\exp(-2*\text{Time})) \leq 20.0$ is satisfied ("$240*(1-\exp(-0.01*P))*\exp(-4175/8.31/\text{Temp})*(1-\exp(-2*\text{Time}))$" is 5.0 or more and 20.0 or less)). The three conditions have such relationships, and thus, the extremely thin region on the surface of the film that mainly contains the cuprous oxide and/or the complex oxide of cuprous oxides can be more appropriately oxidized.

In the oxidation treatment, it is preferable that the surface of the cuprous oxide and/or the complex oxide of cuprous oxides is irradiated with ultraviolet rays having a wavelength of 100 nm or more and 400 nm or less. When the surface is irradiated with ultraviolet rays, the oxidation reaction is promoted. The irradiation intensity of the ultraviolet rays is preferably 0.5 $\mu$W/cm$^2$ (micro watt per cm$^2$) or more and 800 $\mu$W/cm$^2$ (micro watt per cm$^2$) or less, and more preferably 10 $\mu$W/cm$^2$ or more and 500 $\mu$W/cm$^2$ (micro watt per cm$^2$) or less. When the ultraviolet rays are irradiated, the ozone partial pressure (P [Pa]), the treatment temperature (Temp [K]), and the treatment time (Time [min]) in the oxidation treatment preferably satisfy a relationship of $1.0 \leq 240*(1-\exp(-0.01*P))*\exp(-4175/8.31/\text{Temp})*(1-\exp(-2*\text{Time})) \leq 30.0$ ("$240 (1-\exp(-0.01*P))*\exp(-4175/8.31/\text{Temp})*(1-\exp(-2 \text{ Time}))$" is 1.0 or more and 30.0 or less)), preferably satisfy a relationship of $3.0 \leq 240*(1-\exp(-0.01*P))*\exp(-4175/8.31/\text{Temp})*(1-\exp(-2*\text{Time})) \leq 20.0$ ("$240*(1-\exp(-0.01*P))*\exp(-4175/8.31/\text{Temp})*(1-\exp(-2*\text{Time}))$" is 3.0 or more and 20.0 or less)), and still more preferably satisfy a relationship of $5.0 \leq 240*(1-\exp(-0.01*P))*\exp(-4175/8.31/\text{Temp})*(1-\exp(-2*\text{Time})) \leq 15.0$ ("$240*(1-\exp(-0.01*P))*\exp(-4175/8.31/\text{Temp})*(1-\exp(-2*\text{Time}))$" is 5.0 or more and 15.0 or less)). When the surface is irradiated with the ultraviolet rays, the three conditions have such relationships, and thus, the extremely thin region on the surface of the film that mainly contains the cuprous oxide and/or the complex oxide of cuprous oxides can be more appropriately oxidized.

As the step of forming the n-type layer on the film on which the oxidation treatment is performed and which mainly contains the cuprous oxide and/or the complex oxide of cuprous oxides, the n-type layer 4 is formed on the film that mainly contains the cuprous oxide and/or the complex oxide of cuprous oxides by, for example, an atomic deposition (ALD) method or a chemical vapor deposition (CVD) method.

As the step of forming the n-electrode on the n-type layer 4, the n-electrode 5 is formed on the n-type layer 4 by sputtering or the like. When the intermediate layer is provided between the n-type layer 4 and the n-electrode 5, the intermediate layer is formed before the n-electrode 5 is formed. Through the above steps, the solar cell 100 including the substrate 1, the p-electrode 2, the p-type light-absorbing layer 3 in which the oxidation treatment is performed on the surface and which mainly contains the cuprous oxide and/or the complex oxide of cuprous oxides, the n-type layer 4, and the n-electrode 5 is manufactured.

Second Embodiment

A second embodiment relates to a multi-junction solar cell. FIG. 4 illustrates a conceptual sectional diagram of a multi-junction solar cell 200 according to the second embodiment. The multi-junction solar cell 200 of FIG. 4 includes the solar cell (first solar cell) 100 of the first embodiment on the light incident side and a second solar cell 201. The band gap of the photoelectric conversion layer of the second solar cell 201 is smaller than the band gap of the light-absorbing layer 3 of the multi-junction solar cell 200 according to the first embodiment. Incidentally, the multi-junction solar cell according to the embodiment includes a solar cell in which three or more solar cells are joined.

The band gap of the p-type light-absorbing layer 3 of the solar cell 100 according to the first embodiment is about from 2.0 eV to 2.2 eV, and thus the band gap of the light-absorbing layer of the second solar cell 201 is preferably 1.0 eV or more and 1.6 eV or less. The light-absorbing layer of the second solar cell 201 is preferably selected from the group consisting of any one or more compound semiconductor layers among CIGS-based having a high In content and CdTe-based compound semiconductor layers, crystalline silicon and perovskite type compound.

Third Embodiment

Figure 5:
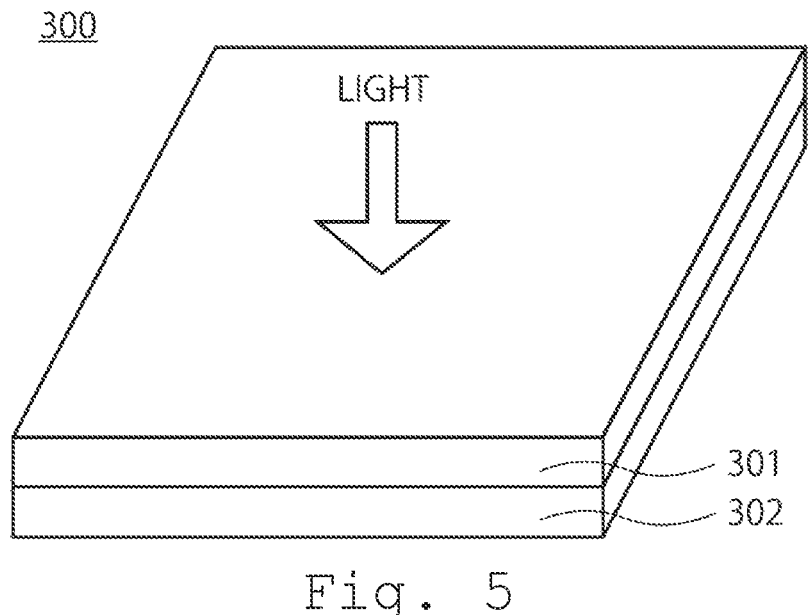
FIG. 5 is a perspective view of a solar cell module according to an embodiment.

A third embodiment relates to a solar cell module. FIG. 5 illustrates a perspective diagram of a solar cell module 300 according to the third embodiment. The solar cell module 300 in FIG. 5 is a solar cell module in which a first solar cell module 301 and a second solar cell module 302 are stacked one on the other. The first solar cell module 301 is on the light incident side and includes the solar cell 100 according to the first embodiment. It is preferable to use the second solar cell 201 in the second solar cell module 302.

Figure 6:
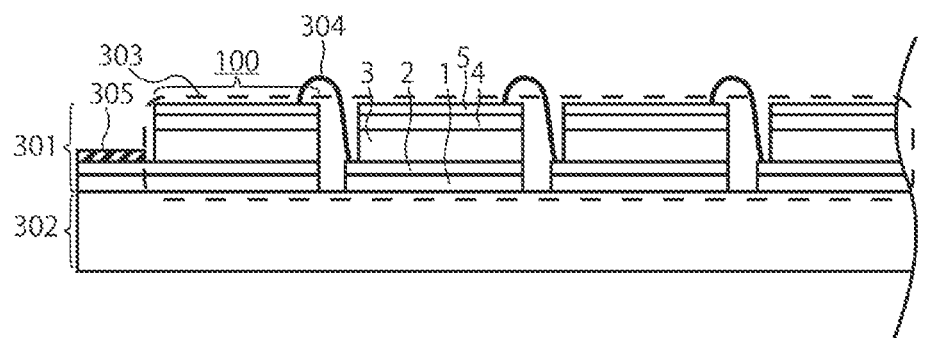
FIG. 6 is a cross-sectional view of a solar cell module according to an embodiment.

FIG. 6 illustrates a sectional diagram of the solar cell module 300. In FIG. 6, the structure of the first solar cell module 301 is illustrated in detail but the structure of the second solar cell module 302 is not illustrated. In the second solar cell module 302, the structure of the solar cell module is appropriately selected depending on the light-absorbing layer of the solar cell to be used. In the solar cell module 300 in FIG. 6, a plurality of submodules 303 in which a plurality of solar cells 100 are arranged in the horizontal direction and electrically connected to each other by a wiring 304 in series and which is enclosed by a broken line are included and the plurality of submodules 303 are electrically connected to each other in parallel or in series. Adjacent submodules are electrically connected by a busbar 305.

In adjacent solar cells 100, the n-electrode 5 on the upper side and the p-electrode 2 on the lower side are connected by the wiring 304. Both ends of the solar cell 100 in the submodule 303 are connected to the busbar 305. The busbar 305 is preferably configured to electrically connect a plurality of submodules 303 in parallel or in series and adjust the output voltage with the second solar cell module 302. Incidentally, the connection system of the solar cell 100 shown in the first embodiment is an example. The solar cell module can be configured by other connection systems.

Fourth Embodiment

Figure 7:
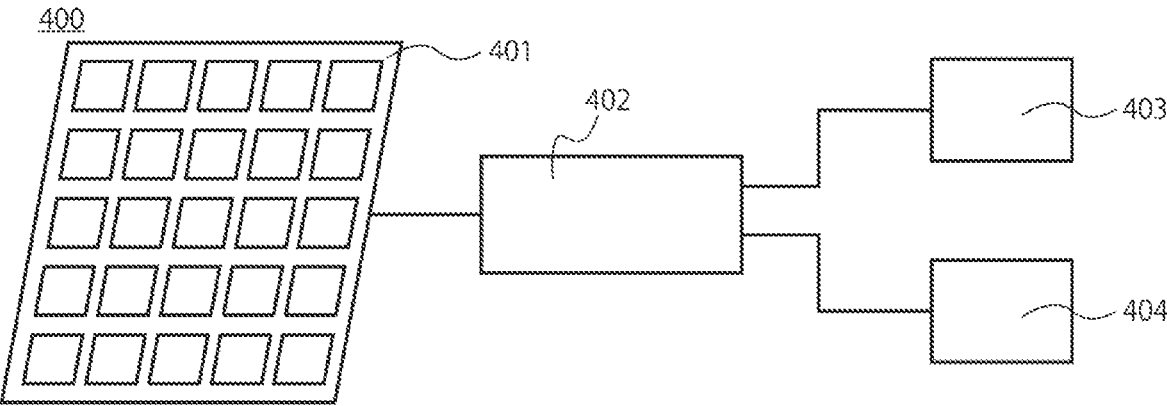
FIG. 7 is a structural view of a photovoltaic power generation system according to an embodiment.

A fourth embodiment relates to a solar photovoltaic power generation system. The solar cell module 300 according to the third embodiment can be used as a generator which generates electric power in the solar photovoltaic power generation system according to the fourth embodiment. The solar photovoltaic power generation system according to the embodiment generates electric power using a solar cell module and specifically includes a solar cell module which generates electric power, a unit which converts the generated electricity into electric power, and a power storage unit which stores the generated electricity or a load which consumes the generated electricity. FIG. 7 illustrates a conceptual diagram of a solar photovoltaic power generation system 400 according to the embodiment. The solar photovoltaic power generation system in FIG. 7 includes a solar cell module 401 (300), a converter 402, a storage battery 403, and a load 404. Either of the storage battery 403 or the load 404 may be omitted. The load 404 may be configured to be able to utilize the electric energy stored in the storage battery 403. The converter 402 is an apparatus including a circuit or a device which performs power conversion such as voltage transformation or DC-AC conversion such as a DC-DC converter, DC-AC-converter, AC-AC-converter and the like. As the configuration of the converter 402, a suitable configuration may be adopted depending on the configuration of the generated voltage, the storage battery 403, and the load 404.

The solar cells included in the solar cell module 300 generate electric power, and the electric energy is converted by the converter 402 and stored in the storage battery 403 or consumed by the load 404. It is preferable to provide the solar cell module 401 with a sunlight tracking and driving apparatus for constantly directing the solar cell module 401 toward the sun or a light collector which collects sunlight or to add an apparatus or the like for improving the power generation efficiency.

It is preferable that the solar photovoltaic power generation system 400 is used for immovable property such as dwellings, commercial facilities, and factories or for movable property such as vehicles, aircraft, and electronic devices. The electric power generation amount is expected to increase as the solar cell having an excellent conversion efficiency according to the embodiment is used in the solar cell module 401.

Figure 8:
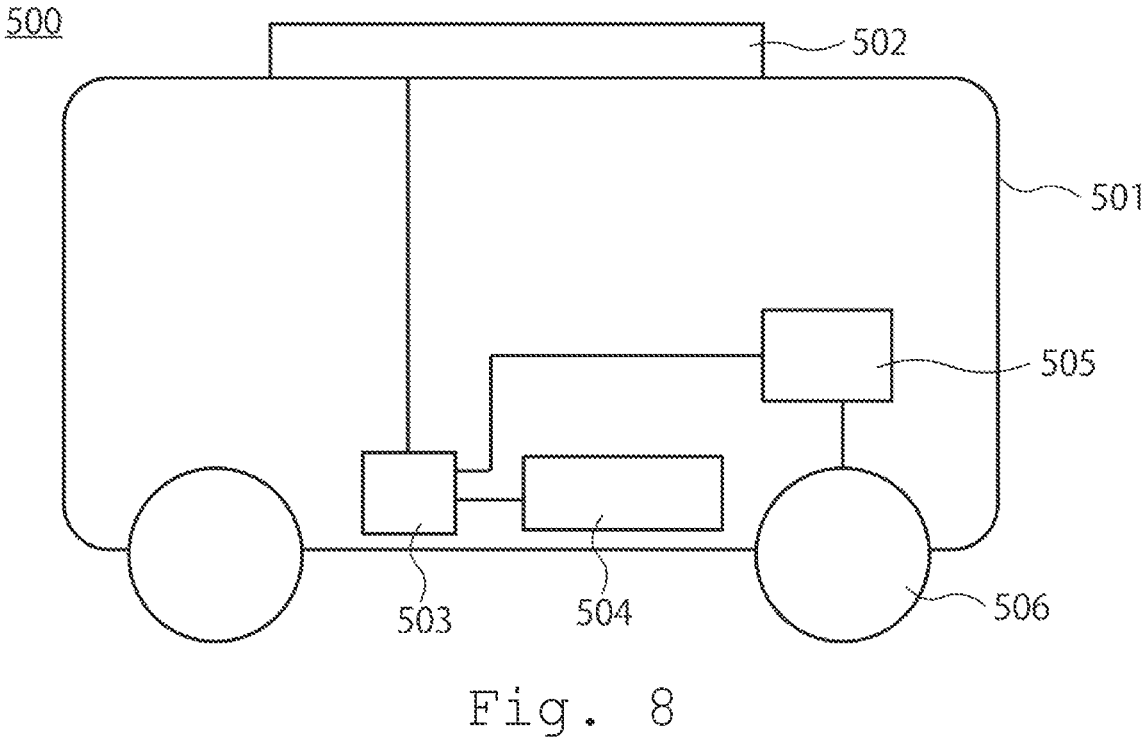
FIG. 8 is a conceptual diagram of a vehicle according to an embodiment.

A vehicle is described as an example of utilization of the solar photovoltaic power generation system 400. FIG. 8 illustrates a conceptual configuration diagram of a vehicle 500. The vehicle 500 in FIG. 8 includes a vehicle body 501, a solar cell module 502, a power converter 503, a storage battery 504, a motor 505, and tires (wheels) 506. The electric power generated by the solar cell module 502 provided on the upper portion of the vehicle body 501 is converted by the power converter 503 and is charged in the storage battery 504 or consumed by a load such as the motor 505. The vehicle 500 can be moved by rotating the tires (wheels) 506 by the motor 505 using the electric power supplied from the solar cell module 502 or the storage battery 504. The solar cell module 502 may not be a multi-junction type but may be configured only of such as the first solar cell module including the solar cell 100 according to the first embodiment. In the case of adopting a transparent solar cell module 502, it is also preferable to use the solar cell module 502 as a window for generating electric power on the side surface of the vehicle body 501 in addition to the upper portion of the vehicle body 501.

Figure 9:
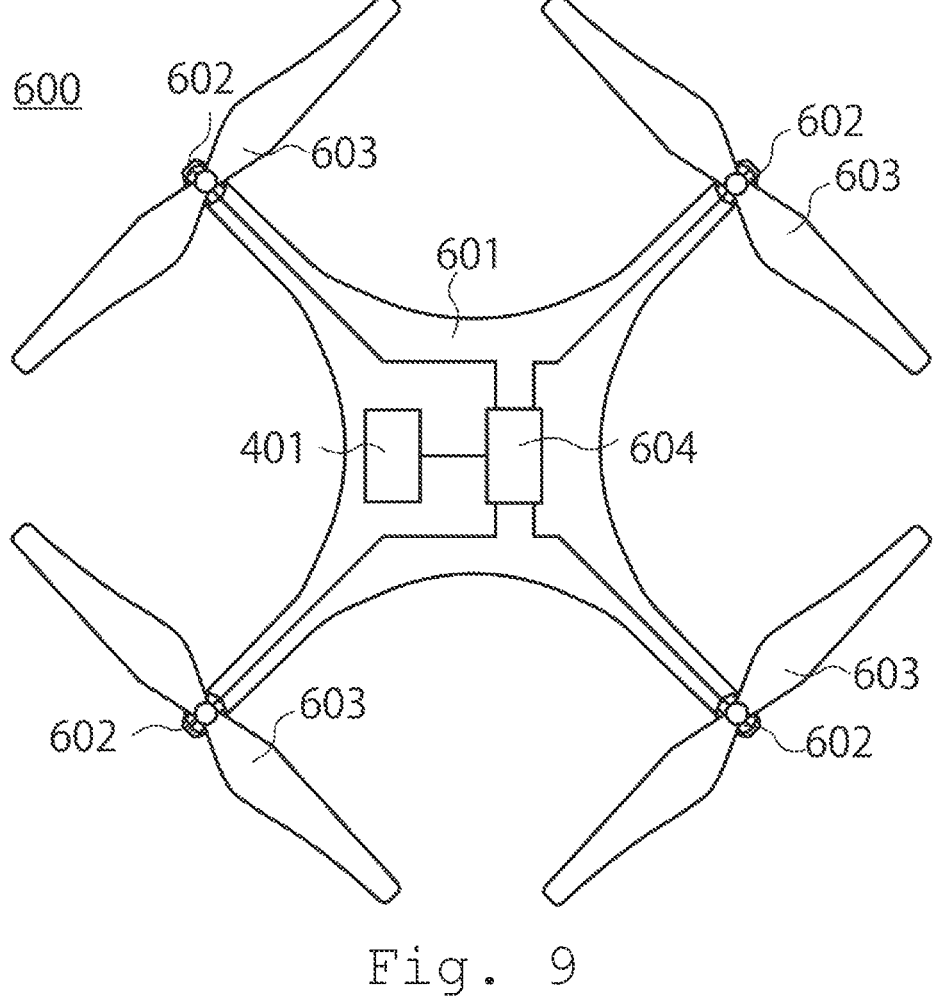
FIG. 9 is conceptual diagram of a flying object.

A flying object (multi-copter) is described as an example of utilization of the solar photovoltaic power generation system 400. The flying object uses a solar cell module 401. The flying object according to the seventh embodiment uses the battery module 400 according to the fourth embodiment. A configuration of the flying object according to the present embodiment will be briefly described using a schematic view of a flying object 600 (quadcopter) of FIG. 9. The flying object 600 includes a solar cell module 401, an aircraft frame 601, motors 602, rotary wings 603, and a control unit 604. The solar cell module 401, the motors 602, the rotary wings 603, and the control unit 604 are disposed in the aircraft frame 601. The control unit 604 converts power output from the solar cell module 401 and adjusts output. The control unit 604 can further include a storage battery that stores the generated power by the solar cell module 401. The motors 602 rotate the rotary wings 603 using the power output from the solar cell module 401. By using the flying object 600 with the present configuration having the solar cell module 401 according to the embodiment, a flying object that can fly using more electric power is provided.

Hereinafter, the present disclosure will be described more specifically based on Examples, but the present disclosure is not limited to the following Examples.

Example 1

ITO (In:Sn=80:20, film thickness 20 nm) and ATO (Sn: Sb=98:2, 150 μm) are deposited on an upper surface of a glass substrate on a side in contact with glass as a p-electrode on a back surface side. A $Cu_2O$ light-absorbing layer is formed on a transparent p-electrode by heating at 500° C. by a sputtering method in an oxygen or argon gas atmosphere. Thereafter, the surface of the $Cu_2O$ light-absorbing layer is partially oxidized under the conditions illustrated in the table of FIG. 10. Subsequently, 10 nm of $Ga_{2.0}O_{3.0}$ is deposited as an n-type layer by the ALD method. An AZO transparent conductive film is deposited as an n-electrode on the n-type layer. A solar cell is obtained by forming an $MgF_2$ film as an antireflection film. The obtained solar cell is evaluated for a short circuit current (Jsc), an open circuit voltage (Voc), a fill factor (FF), conversion efficiency, and transmittance. FIG. 10 also illustrates values of an evaluation formula $[240*(1-\exp(-0.01*P))*\exp(-4175/8.31/Temp)*(1-\exp(-2*Time))]$ of the ozone partial pressure (P [Pa]), the treatment temperature (Temp [K]), and the treatment time (Time [min]) in the oxidation treatment.

Example 2 to Example 30 and Comparative Example 1 to Comparative Example 7

In Examples 2 to 30, a solar cell is fabricated in the same manner as in Example 1 except that the solar cell is oxidized under the conditions illustrated in the table of FIG. 10. The obtained solar cell is evaluated for a short circuit current (Jsc), an open circuit voltage (Voc), conversion efficiency, and translucency. In Comparative Example 2, the oxidation treatment is not performed. In Examples 26 and 27. UV irradiation is performed. In Example 30, air is introduced to increase the total pressure.

Example 31

A solar cell is fabricated in the same manner as in Example 1 except that 10 nm of $Ga_{0.8}Al_{0.2}O_{3.00}$ is deposited as an n-type layer. The obtained solar cell is evaluated for a short circuit current (Jsc), an open circuit voltage (Voc), conversion efficiency, and translucency.

The amount of light is adjusted to 1 sun by using a solar simulator simulating a light source of AM 1.5G and using a reference Si cell under a light source. A temperature in a measurement chamber is 25° C. under an atmospheric pressure. A voltage is swept and a current density (current divided by a cell area) is measured. When a horizontal axis represents the voltage and a vertical axis represents the current density, a point intersecting the horizontal axis represents an open circuit voltage Voc, and a point intersecting the vertical axis represents a short circuit current density Jsc. When the voltage and the current density are multiplied on a measurement curve and maximum points are Vmpp and Jmpp (maximum power point), respectively, FF=(Vmpp*Jmpp)/(Voc*Jsc), and a conversion efficiency Eff. is obtained by Eff.=Voc*Jsc*FF.

In a table related to Examples of FIG. 11, the short circuit current (Jsc), the open circuit voltage (Voc), the conversion efficiency, and the light transmittance of Examples and Comparative Examples are collectively illustrated.

The transmittance is evaluated as A when the transmittance of light in a wavelength band of 700 nm or more and 1200 nm or less is 70% or more, is evaluated as B when the transmittance of light in a wavelength band of 700 nm or more and 1200 nm or less is 60% or more and less than 70%, and is evaluated as C when the transmittance of light in a wavelength band of 700 nm or more and 1200 nm or less is less than 60%.

Jsc is evaluated as A when the conversion efficiency is 1.1 times or more the conversion efficiency of Comparative Example 1, is evaluated as B when the conversion efficiency is 1.0 times or more and less than 1.1 times Jsc of Comparative Example 1, and is evaluated as C when the conversion efficiency is less than 1.0 times Jsc of Comparative Example 1.

Voc is evaluated as A when Voc is 1.3 times or more the conversion efficiency of Comparative Example 1, is evaluated as B when Voc is 1.1 times or more and less than 1.3 times Voc of Comparative Example 1, and is evaluated as C when Voc is less than 1.1 times Voc of Comparative Example 1.

The conversion efficiency is evaluated as A when the conversion efficiency is 1.5 times or more the conversion efficiency of Comparative Example 1, is evaluated as B when the conversion efficiency is 1.1 times or more and less than 1.5 times the conversion efficiency of Comparative Example 1, and is evaluated as C when the conversion efficiency is less than 1.1 times the conversion efficiency of Comparative Example 1.

As can be seen from the tables of FIGS. 10 and 11, the oxidation treatment is performed under appropriate conditions, and thus, Jsc is improved, and the conversion efficiency of the solar cell is improved. When the surface is observed by XRD after the oxidation treatment of Example 1 and Comparative Example 1, peaks of the $Cu_2O$ phase, the CuO phase, and the $Cu(OH)_2$ phase are confirmed in Example 1. When the oxidation treatment is not performed, a peak of the $Cu_2O$ phase is confirmed, but peaks of the CuO phase and the $Cu(OH)_2$ phase are not confirmed. The conversion efficiency is similarly improved in a multi-junction solar cell in which the solar cells of Examples are used as a top cell and a solar cell in which Si is used as a light-absorbing layer is used as a bottom cell.

In the specification, some elements are represented only by chemical symbols for elements.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method for manufacturing a stacked thin film, comprising:

forming a p-electrode on a substrate;

forming a film that mainly contains a cuprous oxide and/or a complex oxide of cuprous oxides on the p-electrode; and performing an oxidation treatment on the film that mainly contains the cuprous oxide and/or the complex oxide of cuprous oxides, wherein an ozone partial pressure in the oxidation treatment is from 5 [Pa] to 200 [Pa] where both the lower and upper endpoints of the ozone partial pressure range are inclusive, a treatment temperature in the oxidation treatment is from 273 [K] to 323 [K] where both the lower and upper endpoint of the treatment temperature range are inclusive, and a treatment time in the oxidation treatment is from 1 second to 60 minutes where both the lower and upper endpoints of the treatment time range are inclusive.

2. The method for manufacturing the stacked thin film according to claim 1, wherein the ozone partial pressure in the oxidation treatment is from 7 [Pa] to 100 [Pa] where both the lower and upper endpoints of the ozone partial pressure range are inclusive, the treatment temperature in the oxidation treatment is from 283 [K] to 308 [K] where both the lower and upper endpoint of the treatment temperature range are inclusive, and the treatment time in the oxidation treatment is from 1 minute to 30 minutes where both the lower and upper endpoints of the treatment time range are inclusive.

3. The method for manufacturing the stacked thin film according to claim 1, wherein the ozone partial pressure in the oxidation treatment is from 10 [Pa] to 50 [Pa] where both the lower and upper endpoints of the ozone partial pressure range are inclusive, the treatment temperature in the oxidation treatment is from 283 [K] to 308 [K] where both the lower and upper endpoint of the treatment temperature range are inclusive, and the treatment time in the oxidation treatment is from 1 minute to 10 minutes where both the lower and upper endpoints of the treatment time range are inclusive.

4. The method for manufacturing the stacked thin film according to claim 1, wherein, when the ozone partial pressure in the oxidation treatment is P [Pa], the treatment temperature in the oxidation treatment is Temp [K], and the treatment time in the oxidation treatment is Time [minutes], a relationship of $1.0 \leq 240*(1-\exp(-0.01*P))*\exp(-4175/8.31/Temp)*(1-\exp(-2*Time)) \leq 50.0$ is satisfied.

16

5. The method for manufacturing the stacked thin film according to claim 1, wherein a total pressure in the oxidation treatment is from 5 [Pa] to 10000 [Pa] where both the lower and upper endpoints of the total pressure range are inclusive.

6. The method for manufacturing the stacked thin film according to claim 1, wherein, when the ozone partial pressure in the oxidation treatment is P [Pa], the treatment temperature in the oxidation treatment is Temp [K], and the treatment time in the oxidation treatment is Time [minutes], a relationship of $3.0 \leq 240*(1-\exp(-0.01*P))*\exp(-4175/8.31/Temp)*(1-\exp(-2*Time)) \leq 35.0$ is satisfied.

7. The method for manufacturing the stacked thin film according to claim 1, wherein, in the oxidation treatment, a surface of the cuprous oxide and/or the complex oxide of cuprous oxides is irradiated with ultraviolet rays with a wavelength from 100 nm to 400 nm where both the lower and upper endpoints of the wavelength range are inclusive, and irradiation intensity of the ultraviolet rays is from 0.5 $\mu$W/cm$^2$ to 800 $\mu$W/cm$^2$ where both the lower and upper endpoints of the range of the irradiation intensity of the ultraviolet rays are inclusive.

8. The method for manufacturing the stacked thin film according to claim 1, wherein, in the oxidation treatment, a surface of the cuprous oxide and/or the complex oxide of cuprous oxides is irradiated with ultraviolet rays with a wavelength from 100 nm to 400 nm where both the lower and upper endpoints of the wavelength range are inclusive, irradiation intensity of the ultraviolet rays is from 0.5 $\mu$W/cm$^2$ to 800 $\mu$W/cm$^2$ where both the lower and upper endpoints of the range of the irradiation intensity of the ultraviolet rays are inclusive, and when the oxygen partial pressure in the oxidation treatment is P [Pa], the treatment temperature in the oxidation treatment is Temp [K], and the treatment time in the oxidation treatment is Time [minutes], a relationship of $1.0 \leq 240*(1-\exp(-0.01*P))*\exp(-4175/8.31/Temp)*(1-\exp(-2*Time)) \leq 50.0$ is satisfied.

9. The method for manufacturing the stacked thin film according to claim 1, wherein, in the oxidation treatment, a surface of the cuprous oxide and/or the complex oxide of cuprous oxides is irradiated with ultraviolet rays with a wavelength from 100 nm to 400 nm where both the lower and upper endpoints of the wavelength range are inclusive, irradiation intensity of the ultraviolet rays is from 0.5 $\mu$W/cm$^2$ to 800 $\mu$W/cm$^2$ where both the lower and upper endpoints of the range of the irradiation intensity of the ultraviolet rays are inclusive, and when the oxygen partial pressure in the oxidation treatment is P [Pa], the treatment temperature in the oxidation treatment is Temp [K], and the treatment time in the oxidation treatment is Time [minutes], a relationship of $3.0 \leq 240*(1-\exp(-0.01*P))*\exp(-4175/8.31/Temp)*(1-\exp(-2*Time)) \leq 35.0$ is satisfied.

10. The method for manufacturing the stacked thin film according to claim 1, wherein, in the oxidation treatment, a surface of the cuprous oxide and/or the complex oxide of cuprous oxides is irradiated with ultraviolet rays with a wavelength from 100 nm to 400 nm where both the lower and upper endpoints of the wavelength range are inclusive, irradiation intensity of the ultraviolet rays is from 0.5 $\mu W/cm^2$ to 800 $\mu W/cm^2$ where both the lower and upper endpoints of the range of the irradiation intensity of the ultraviolet rays are inclusive, and when the oxygen partial pressure in the oxidation treatment is P [Pa], the treatment temperature in the oxidation treatment is Temp [K], and the treatment time in the oxidation treatment is Time [minutes], a relationship of $5.0 \leq 240*(1-\exp(-0.01*P))*\exp(-4175/8.31/Temp)*(1-\exp(-2*Time)) \leq 20.0$ is satisfied.

11. The method for manufacturing the stacked thin film according to claim 1, wherein irradiation intensity of the ultraviolet rays is from 10 $\mu W/cm^2$ to 800 $\mu W/cm^2$ where both the lower and upper endpoints of the range of the irradiation intensity of the ultraviolet rays are inclusive.

12. The method for manufacturing the stacked thin film according to claim 1, further comprising:

forming an n-type layer on the film which the oxidation treatment is performed and which mainly contains the cuprous oxide and/or the complex oxide of cuprous oxides.

13. The method for manufacturing the stacked thin film according to claim 1, wherein a total pressure in the oxidation treatment is from 5 [Pa] to 5000 [Pa] where both the lower and upper endpoints of the total pressure range are inclusive.

14. The method for manufacturing the stacked thin film according to claim 1, wherein a total pressure in the oxidation treatment is from 5 [Pa] to 1000 [Pa] where both the lower and upper endpoints of the total pressure range are inclusive.

15. A method for manufacturing a solar cell, comprising:

forming the p-electrode on the substrate according to the method for manufacturing the stacked thin film according to claim 1;

forming the film that mainly contains the cuprous oxide and/or the complex oxide of cuprous oxides on the p-electrode according to the method for manufacturing a stacked thin film according to claim 1;

performing an oxidation treatment on the film that mainly contains the cuprous oxide and/or the complex oxide of cuprous oxides on the p-electrode according to the method for manufacturing a stacked thin film according to claim 1;

forming an n-type layer on the film on which an oxidation treatment is performed and which mainly contains the cuprous oxide and/or the complex oxide of cuprous oxides; and forming the n-electrode on the n-type layer.

16. The method for manufacturing a solar cell according to claim 15, further comprising:

incorporating the solar cell into a multi-junction solar cell.

17. The method for manufacturing a solar cell according to claim 15, further comprising:

incorporating the solar cell into a solar cell module.

18. The method for manufacturing a solar cell according to claim 15, further comprising:

incorporating the solar cell into a photovoltaic power generation system.

* * * * *